United States Patent [19]
Adkins

[11] Patent Number: 6,157,264
[45] Date of Patent: Dec. 5, 2000

[54] PHASE-LOCKED LOOP WITH TUNABLE OSCILLATOR

[75] Inventor: Kenneth C. Adkins, Fremont, Calif.

[73] Assignee: Summit Microelectronics, Inc., Campbell, Calif.

[21] Appl. No.: 09/364,515

[22] Filed: Jul. 30, 1999

[51] Int. Cl.[7] .............................. H03L 7/085; H03L 7/18
[52] U.S. Cl. .............................. 331/25; 331/1 A; 331/16; 331/17; 327/156; 327/159
[58] Field of Search .............................. 331/1 A, 16, 17, 331/25; 327/156–159; 375/376; 455/260; 360/51

[56] References Cited

U.S. PATENT DOCUMENTS 4,280,224   7/1981   Chethik .................................. 375/116

*Primary Examiner*—David Mis
*Attorney, Agent, or Firm*—Fernandez & Associates, LLP

[57] ABSTRACT

A phased-lock loop is disclosed for capturing the frequency of the input signal by adjusting a tunable oscillator such that a zero-crossing detector detects a zero-crossing point of the input signal relative to a predetermined number of counts at a counter where a control logic increments a tuning counter to increase the frequency at the tunable oscillator while decrements the tuning counter to decrease the frequency in the tunable oscillator. The predetermined number of counts at the counter representing one period, a fraction of a period, or a multiple of a period of the frequency of the input signal. The control logic adjusts the count at the tuning counter until the tunable oscillator generates an internal frequency that captures the frequency of the input signal.

17 Claims, 6 Drawing Sheets

PHASE-LOCKED LOOP WITH TUNABLE OSCILLATOR

FIELD OF INVENTION

The present invention relates generally to electronics, and more particularly to synchronizing input signals with an internal oscillator in a phase-locked loop.

BACKGROUND INFORMATION

A phased-locked loop (PLL) has many industrial applications such as FM demodulators, stereo demodulators, tone detectors, and frequency synthesizers. A PLL performs a capturing process in which the loop goes from an unlocked, or free-running condition, to a locked condition onto the frequency of the input signal when the frequency of the voltage-controlled oscillator is equal to the frequency of the input signal. This capturing process has been implemented with a phase detector that is driven by analog signals and digital square-wave signals.

FIG. 1 (Prior Art) is a block diagram illustrating a phased-locked loop 10 containing a phase detector 12, a loop filter 14, an amplifier 16, a voltage-controlled oscillator (VCO) 18. The phase detector 12 receives a first input at a first frequency, denoted by the symbol $f_{in}$, and a second input at a second frequency generated by the VCO, denoted by the symbol $f_{vco}$. The second input is also referred to as a feedback signal. The phase detector 12 compares the two input frequencies, $f_{in}$ and $f_{vco}$, and generates an output that represents the phase difference between the two input frequencies. The phase detector 12 can be implemented as a frequency multiplier that multiplies the feedback signal. The loop filter 14 filters the input signal. The amplifier 16 amplifies the filtered signal from the loop filter 14. If there is a phase differential between $f_{in}$ and $f_{vco}$, then the input into the VCO 18 operates as an error signal which will adjust the frequency setting in the voltage-controlled oscillator 18. A signal may travel through several iterations around the loop until the VCO 18 adjusts $f_{vco}$ to be in synchronization with $f_{in}$ and $f_{vco}$. Upon which time, the VCO 18 voltage-controlled of the PLL 10 recovers and completes the synchronization operations.

For background information on PLL, the reader is referred to Analysis and Design of Analog Integrated Circuits, Second Edition, Paul R. Gray and Robert G. Meyer, 1997, pp. 605–622; The Art of Electronics, Paul Horowitz and Winfield Hill, 1980, pp. 428–437. The content of this document is incorporated herein by reference.

However, as the vast array of technologies converge into a digital world, the traditional PLL that was originally designed with the intention to capture the input frequency with an analog circuit is less compatible with other digital circuits. Accordingly, it is desirable to have a PLL method and system for capturing the frequency of an input signal that is more suitable for coupling with other digital circuits.

SUMMARY OF INVENTION

The present invention overcomes the foregoing limitations by disclosing a phased-lock loop system comprising: (1) a zero-crossing detector having inputs for receiving a first input signal at a first frequency and a second input signal at a second frequency, the zero-crossing detector generating an output signal each time the first input signal reaching a zero-crossing point; and (2) an oscillator for generating and tuning the second frequency that synchronizes at a discrete level with the first frequency.

The PLL in the present invention advantageously provides a circuit that improves the coupling with other digital circuitry. Additionally, the floor area in an integrated circuit die is significantly reduced using the implementation of the PLL as described in the present invention.

DETAILED DESCRIPTION OF PREFERRED EMBODIMENT(S)

Figure 1:
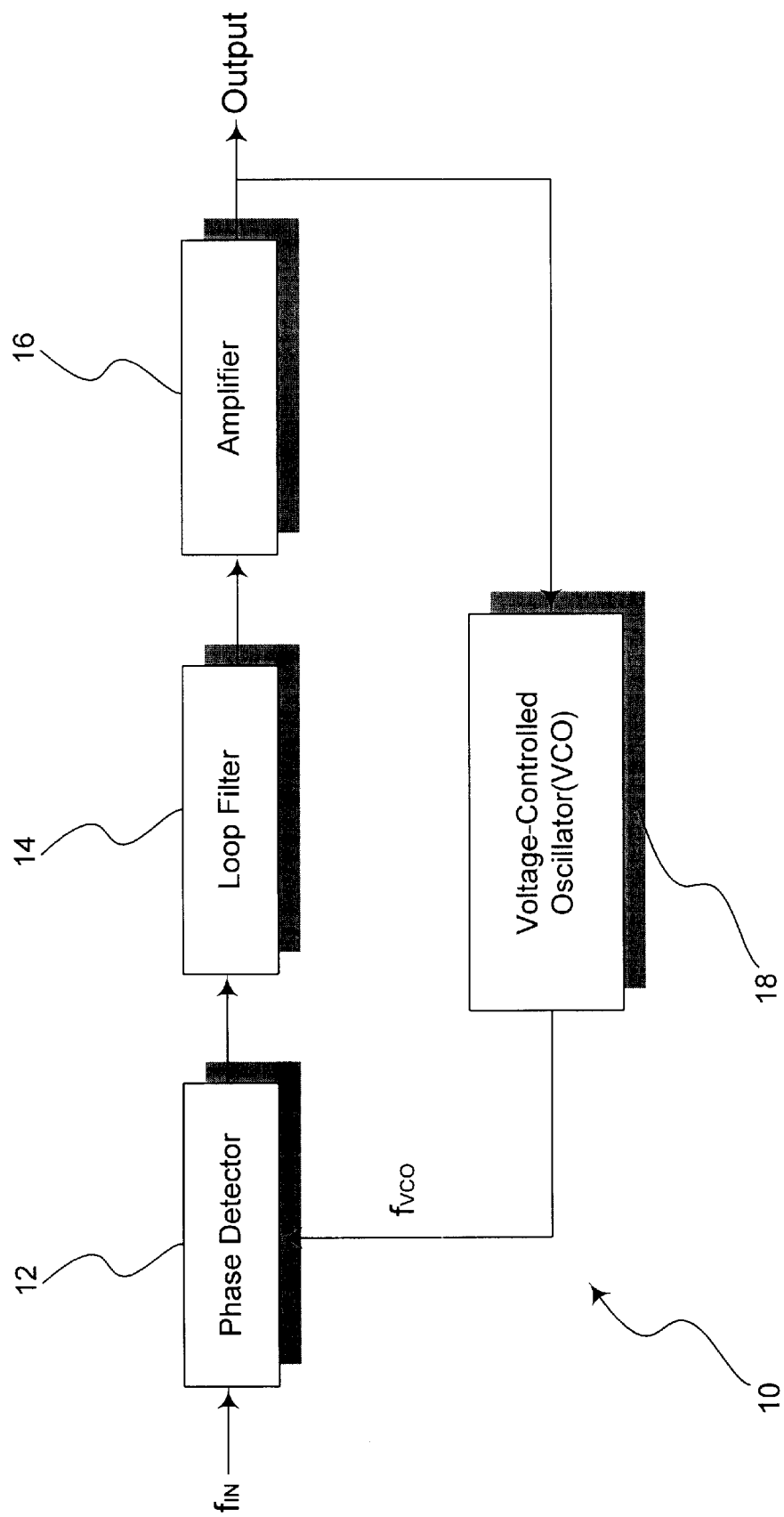
FIG. 1 (Prior Art) is a block diagram illustrating a phased-locked loop with a phase detector and voltage-controlled oscillator.
Figure 2:
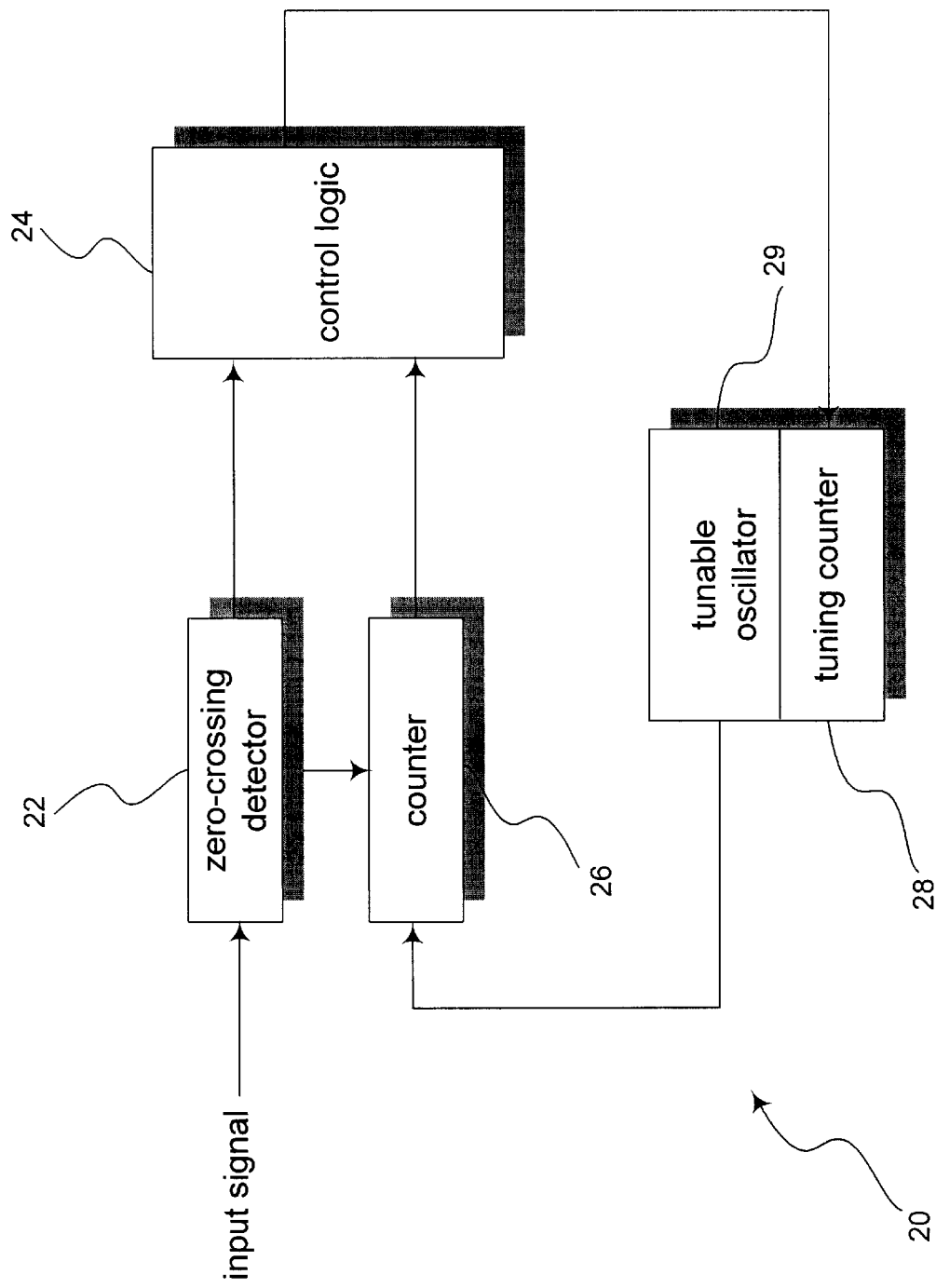
FIG. 2 is a block diagram illustrating a phased-locked loop with a zero-crossing detector and tunable oscillator in the present invention.

FIG. 2 is a block diagram illustrating a phased-locked loop 20 with a tunable oscillator of the present invention. The phased-locked loop 20 includes a zero-crossing detector 22, a control logic 24, a counter 26, a tuning counter 28, and a tunable oscillator 29. The zero-crossing detector 22 detects where an input signal crosses through zero and generates a digital pulse to the control logic 24 every time the input signal reaches the zero line. The control logic 24 determines whether the count of the counter 26 has counted to a predetermined highest count when the next zero-crossing occurs. The control logic 24 generates either one of the three possible outputs, a count up, a count down, or no change, depending on the adjustment necessary to the tuning counter 28 in order to change the frequency setting in the tunable oscillator 29. The frequency in the tunable oscillator 29 is set initially to a normal internal circuitry frequency. The frequency differential between the input signal and a multiple of the tunable oscillator 29 will cause the control logic 24 to count up if the frequency of the tunable oscillator 29 is too slow, count down if the frequency of the tunable oscillator 29 is too fast, or no change if the tunable oscillator 29 is in synchronization with the input signal. The tuning counter 28 increments and decrements in digital or discrete steps. The increment in count in the tuning counter 28 will in turn increase the frequency in the tunable oscillator 29 to match with the input signal. Conversely, the decrement in count in tuning counter 28 decreases the frequency in the tunable oscillator 29 to match the input signal.

The counter 26 is used to perform a frequency shift of the tunable oscillator 29. The number of bits in the counter 26 is selected as to place the frequency of the tunable oscillator 29 in the order of magnitude near the frequency of the input signal. The counter 26 operates in conjunction with the tuning counter 28, which adjusts the frequency in the tunable oscillator 29, such that the input signal hits a zero-crossing when the counter 26 reaches the highest bit count. For example, the counter 26 has a predetermined binary bit count at 256. At time zero, the input signal is received by the zero-crossing detector 22, which generates a digital pulse to the control logic 24 and while resetting the counter 26 to zero. The tuning counter 29 drives the frequency in the tunable oscillator 29. At some later point in time when the counter 26 reaches 256 counts, but the input signal has yet to reach a subsequent second zero-crossing, this scenario indicates that the tunable oscillator 29 is operating too fast or running at a higher frequency than the input signal. As a result, the control logic 24 decrements the count at the tuning counter 28, and thus decreases the oscillator frequency at the tunable oscillator 29. This iterative process continues until the frequency of the tunable oscillator 29 is at some multiple of the frequency of the input signal.

Figure 3:
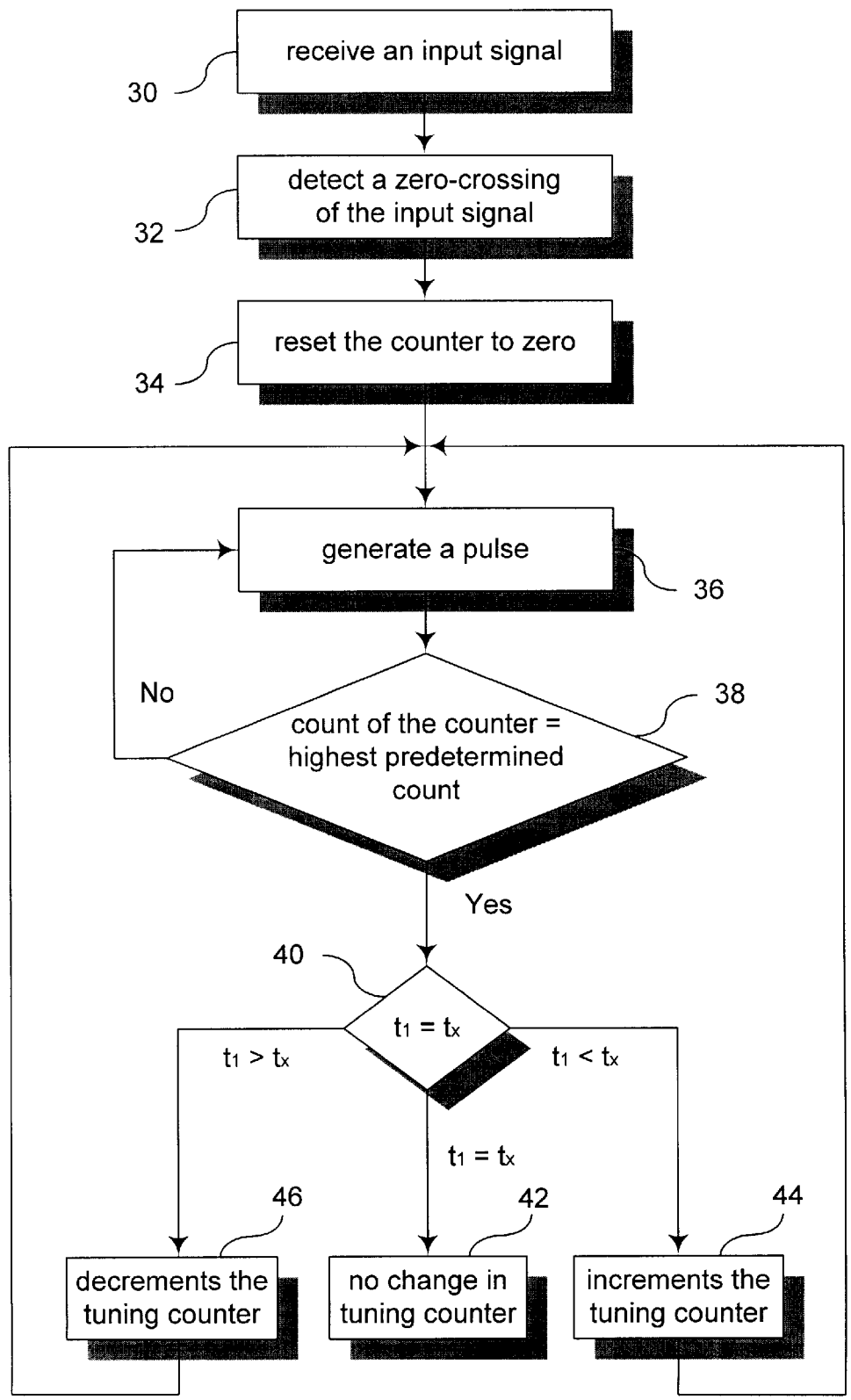
FIG. 3 is a simplified flow chart illustrating the process of synchronizing the frequencies between an input signal and a tunable oscillator in the present invention.

FIG. 3 is a simplified flow chart illustrating the process in synchronizing the frequencies between an input signal and a tunable oscillator in the present invention. At a step 30, the zero-crossing detector 22 receives an input signal. At a step 32, the zero-crossing detector 22 detects the first zero-crossing of the input signal. At a step 34, the counter 26 is reset to zero. At a step 36, the tunable oscillator 29 generates a pulse at the falling edge when the counter 26 increments to the next bit count. At a step 38, the count of the counter 26 continues until the counter 26 reaches a predetermined highest number of binary digit. If the count of the counter 26 has yet to reach the predetermined highest number, then the tunable oscillator continues to generate a pulse at the falling edge. However, if the count of the counter 26 has reached the predetermined highest count, then the process proceeds to a step 40. At the step 40, the zero-crossing detector 29 compares the time occurrence of the next zero-crossing, denoted by the symbol $t_1$, verses the time occurrence at the falling edge of the tunable oscillator 29, denoted by the symbol $t_x$. At a step 42, if the frequency of the input signal is in sync with the frequency of the tunable oscillator 29, where $t_1=t_x$, the control logic 24 does not change the count in the tuning counter 28. If the frequency of the tunable oscillator 29 is too slow relative to frequency of the input signal 2, or $t_1<t_x$, the control logic 24 generates a "count up" signal to the tuning counter 28 to increase the frequency of the tunable oscillator 29. Thus, the tunable oscillator 29 is sync up until the frequency of the tunable oscillator 29 is in sync with the frequency of the input signal. If the frequency of the tunable oscillator 29 is too fast relative to frequency of the input signal, where $t_1>t_x$, the control logic 24 generates a "count down" signal to the tuning counter 28 to decrease the frequency of the tunable oscillator 29. Thus, the tunable oscillator 29 is sync down until the frequency of the tunable oscillator 29 is in sync with the frequency of the input signal. FIG. 3 is intended to show a general illustration of the flow process of synchronizing an input signal with a zero-crossing detector and a tunable oscillator, such that several variations, including the examples illustrated in FIGS. 4A–4C, are within the contemplation of the invention.

Figure 4A:
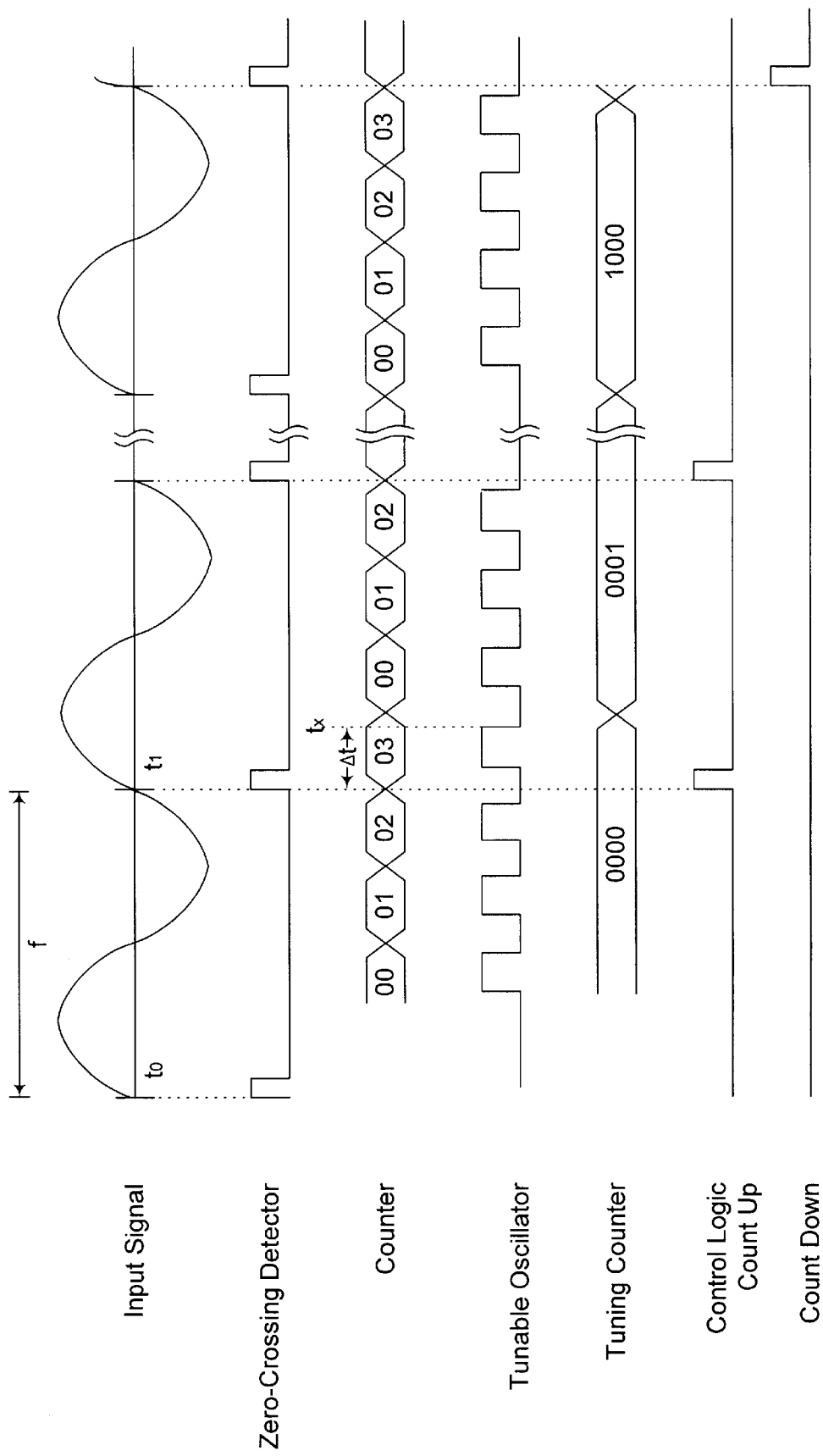
FIG. 4A is a composite timing diagram of a first example where the tunable oscillator runs at a lower frequency than the input signal in the present invention.
Figure 4B:
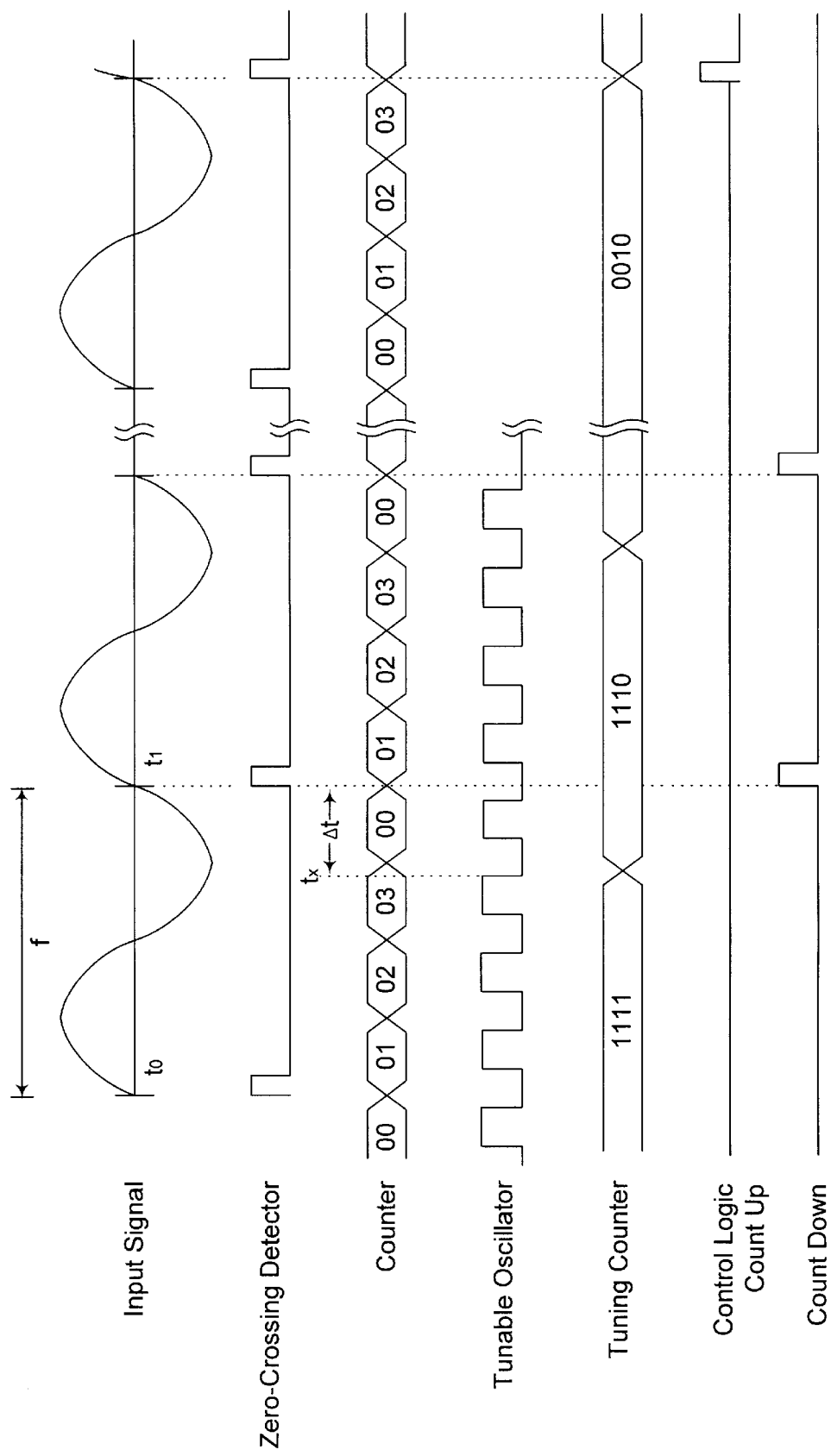
FIG. 4B is a composite timing diagram of a second example where the tunable oscillator runs at a higher frequency than the input signal in the present invention.
Figure 4C:
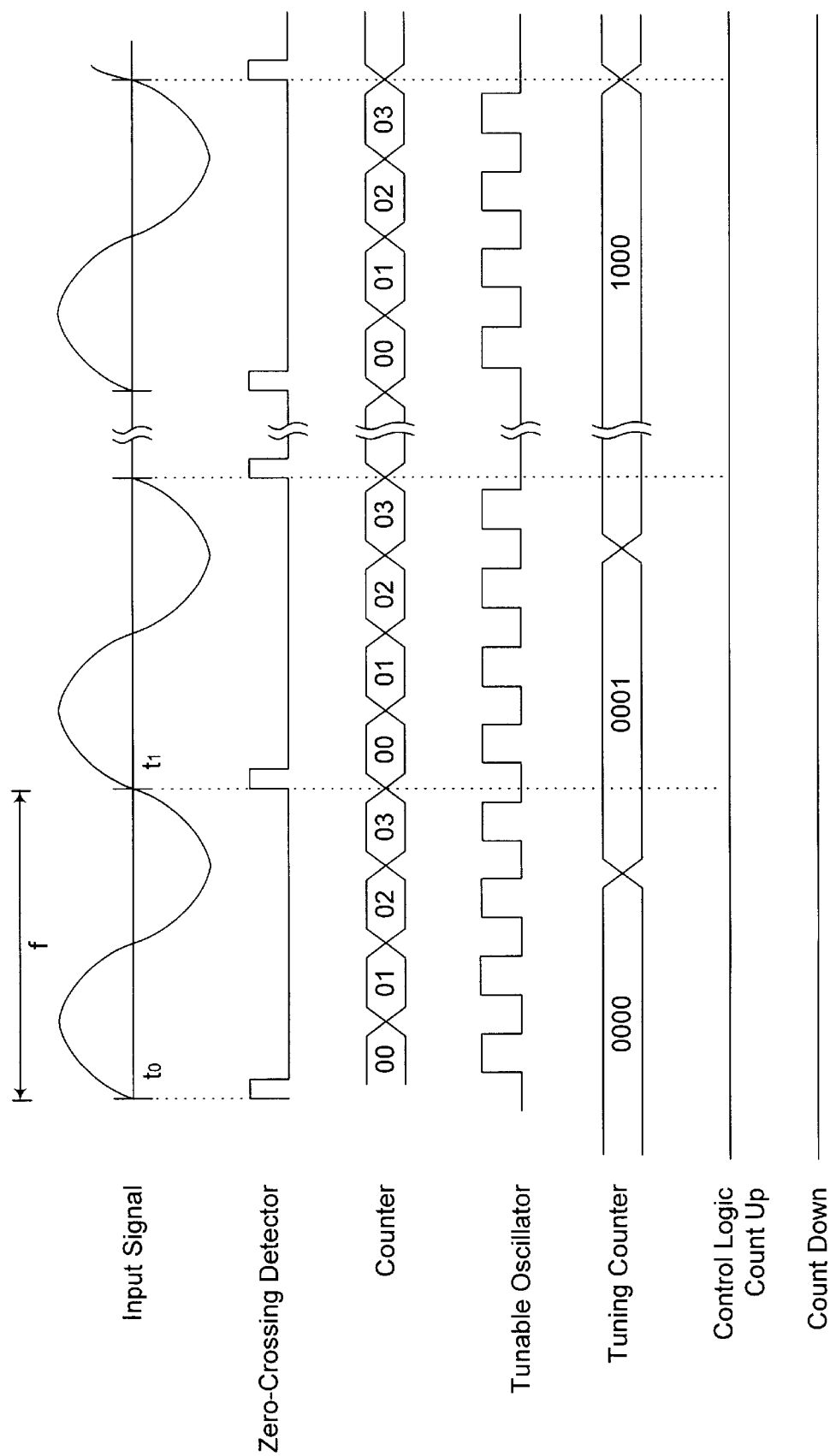
FIG. 4C is a composite timing diagram of a third example where the tunable oscillator is in sync with the frequency of the input signal in the present invention.

FIG. 4A is a composite timing diagram of a first example where the tunable oscillator 29 runs at a lower frequency than the input signal in the present invention. In this example, the input signal is at 60 Hz, while the tunable oscillator operates at 230 Hz. Also, the counter 28 contains four counts from 00 to 11 and the tuning counter 28 contains four bits. At to, the zero-crossing detector 29 receives the first zero-crossing of the input signal and generates a zero-crossing pulse. The zero-crossing pulse is denoted by the darken vertical bar on the input signal time line. The time difference between $t_0$ and $t_1$ represents one period, denoted by 1/f. The symbol $t_1$ denotes the time location when the next zero-crossing detection occurs. At $t_1$, the zero-crossing detector 29 generates a second zero-crossing pulse. The time lag, or the inverse frequency differential between a zero-crossing point and the tunable oscillator 29, is denoted by $\Delta t$, where $\Delta t=t_1-t_x$. The symbol $t_x$ represents the time location of the tunable oscillator 29 when the count in the counter 26 reaches four.

When the second zero-crossing occurs at $t_1$, the counter 26 has generated only three counts and has yet to produce the fourth count within the period. The tunable oscillator 29 has generated only three pulses by this time. The lagging in the fourth pulse indicates that the tunable oscillator 29 is running at a frequency which is too slow relative to the input signal. In such scenario, the control logic 24 will generate a signal to the tuning counter 28 to count up in order to increase the frequency of the tunable oscillator 29. Consequently, the tuning counter 28 increments from 0000 to 0001 to increase the frequency of the tunable oscillator 29. At the next zero-crossing, if the frequency of the tunable oscillator 29 is still too slow comparing to the input signal, the control logic 24 again will generate another signal to the tuning counter 28 to count up. This iterative process continues until the frequency of the tunable oscillator 29 is faster than the frequency of the input signal. At that point when the four count of the counter 26 occurs just ahead of a subsequent zero-crossing, the control logic 24 will count down and thus reducing the frequency of the tunable oscillator 29. When the control logic 24 toggles between count-up and count-down, such scenario that the tunable oscillator 29 has captured the approximate frequency of the input signal. Optionally, when the control logic 24 begins to oscillate between count-up and count-down, the control logic 24 can fine tune the frequency by a smaller step, such as 0.10 Hz or smaller.

To further illustrate this example, the tunable counter 28 contains 4 bits to adjust the frequency of the tunable oscillator 29. As shown in Table 1, when the tunable counter 28 contains a binary sequence of 0000, the tunable oscillator 29 operates at 230 Hz. When the binary sequence is 1111, the tunable oscillator 29 operates at 245 Hz. As the count in the tunable counter 28 increments by one, the frequency of the tunable oscillator 29 correspondingly increments by one. Suppose that the frequency of the tunable oscillator 29 operates at 60 Hz and if the counter 26 is set at count four, the tunable oscillator 29 is preferably set at approximately 240 Hz.

TABLE 1

Tunable Counter Bit Assignments

| Tunable Counter | Tunable Oscillator Frequency |
| --- | --- |
| 0000 | 230 Hz |
| 0001 | 231 Hz |
| 0010 | 232 Hz |
| 0011 | 233 Hz |
| 0100 | 234 Hz |
| 0101 | 235 Hz |
| 0110 | 236 Hz |
| 0111 | 237 Hz |
| 1000 | 238 Hz |
| 1001 | 239 Hz |
| 1010 | 240 Hz |
| 1011 | 241 Hz |
| 1100 | 242 Hz |
| 1101 | 243 Hz |
| 1110 | 244 Hz |
| 1111 | 245 Hz |

If the tunable oscillator 29 is operating too fast relative to the input signal, the control logic 24 will generate a signal to the tuning counter 28 to count-down. The Δt will progressively become smaller in value in narrowing the gap between $t_1$ and $t_x$. This iterative process repeats until the occurrence of the counter 26 at count four coincide with the occurrence of the next zero-crossing detection.

FIG. 4B is a composite timing diagram of a second example where the tunable oscillator 29 runs at a higher frequency than the input signal in the present invention. In this timing diagram, the internal frequency of the tunable oscillator 29 is faster than the input signal, where $t_x$ occurs prior to $t_1$. To phrase it in another way, the counter 26 has already reached the four count at $t_x$, but the corresponding zero-crossing point will occur at a later point in time. Upon reaching the next zero-crossing detection, the control logic 24 generates a signal to the tuning counter 28 to count-down and thus decreases the frequency at the tunable oscillator 29.

The tuning counter 28 decrements from 1111 to 1110 as to decrease the frequency of the tunable oscillator 29. At the next zero-crossing, if the frequency of the tunable oscillator 29 is still too fast comparing to the frequency of the tunable oscillator 29, the control logic again will count down. This iterative process continues until the frequency of the tunable oscillator 29 is faster than the frequency of the input signal. At that point when the four count of the counter 26 occurs just slightly behind a zero-crossing, the control logic 24 will count up and thus increasing the frequency of the tunable oscillator 29. Optionally, when the control logic 24 begins to oscillate between count up and count down, the control logic 24 can fine tune the frequency by a smaller step, such as 0.10 Hz.

FIG. 4C is a composite timing diagram of a third example where the tunable oscillator is in sync with the frequency of the input signal in the present invention. In this scenario, the subsequent zero-crossing at t1 coincide with the completion of four counts of the counter 26. Thus, the frequency of the tunable oscillator 29 is in sync with the frequency of the input signal. Each set of four counts in the counter 26 equates to one period of input signal, or the distance between two zero-crossing points. Consequently, the control logic will not need to count up or count down, but will keep the tuning counter unchanged so that the frequency of the tunable oscillator 29 remain the same.

Foregoing described embodiments of the invention are provided as illustrations and descriptions. For example, the tuning counter 13 can perform a binary search so that the frequency of the tunable oscillator increments by x Hz instead of incrementing by 1 Hz at a time. In particular, Applicant contemplates that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by claims following.

What is claimed is:

1. A system comprising:
   a zero-crossing detector having inputs for receiving a first input signal at a first frequency and a second input signal at a second frequency, said zero-crossing detector generating an output signal each time the first input signal reaching a zero-crossing point; and
   an oscillator coupled to said zero-crossing detector, for generating and tuning the second frequency that synchronizes at a discrete level with the first frequency.

2. The system of claim 1 further comprising a first counter coupled to said oscillator for incrementing or decrementing the second frequency, said first counter containing a plurality of binary digits wherein each binary digit corresponds to a specific frequency.

3. The system of claim 1 further comprising a second counter coupled between said zero-crossing detector and said oscillator, said second counter containing a predetermined number of binary counts representing one period of the first frequency.

4. The system of claim 3 wherein said zero-crossing detector generating a zero-crossing point for one period, a fraction of a period, or a multiple of one period.

5. The system of claim 4 further comprising a control logic for generating an output signal that triggers the first counter to increment or decrement the count in said first counter, said control logic having a first input coupled to said zero-crossing detector, a second input coupled to said first second counter, and an output coupled to said first counter.

6. A method for synchronization an input signal, comprising the steps of:
   generating a first and second zero-crossing points of the input signal, the time window between said first and second zero-crossing points representing one time period, one time period representing the inverse of a first frequency of the input signal;
   generating a second frequency by an internal oscillator; and
   comparing the first frequency to the second frequency to determine if the two frequencies are in synchronization.

7. The method of claim 6 further comprising the step detecting a zero-crossing point of the input signal by a zero-crossing detector.

8. The method of claim 6 further comprising the step of setting the second frequency in the tuning oscillator by a tuning counter.

9. The method of claim 6 further comprising the step of containing a predetermined number of binary counts by a counter representing one period of the first frequency.

10. The method of claim 9 further comprising the step of resetting the counter to zero when the zero-crossing detector initially receives the input signal.

11. The method of claim 8 further comprising the step of incrementing the binary count at the tuning counter if the second frequency is less than the first frequency.

12. The method of claim 8 further comprising the step of decrementing the binary count at the tuning counter if the second frequency is greater than the first frequency.

13. A phase-locked loop, comprising:
   zero-crossing means for detecting the input signal at a first frequency and for generating a zero-crossing point of an input signal; and
   oscillating means, coupled to said zero-crossing means, for generating a feedback signal at a second frequency.

14. The phased-locked loop of claim 13 further comprising first counting means for adjusting the second frequency at the oscillator means, said first counting means incrementing the count to increase the second frequency at the oscillator means, said first counting means decrementing the count to decrease the second frequency at the oscillator means, said first counting means coupled to said oscillating means.

15. The phased-locked loop of claim 13 further comprising second counting means, said second counting means containing a predetermined number of counts representing one period of the first frequency, said second counting means coupled between said zero-crossing means and said oscillating means.

16. The phased-locked loop of claim 13 further comprising control logic means for controlling the count of said first counting means, said control logic means incrementing the count of said first counting means if the second frequency is less than the first frequency, said control logic means decrementing the count of said first counting means if the second frequency is greater than the first frequency, said counting means having a first input coupled to said zero-crossing means, a second input coupled to said second counting means, and an output coupled to said first counting means.

17. The phased-locked loop of claim 13 wherein said second counting means is reset to zero when said zero-crossing means initially receives the input signal.

* * * * *